a plurality of times with laser pulses at a first time interval and a predetermined distance interval between irradiations. Each irradiation performed at the first time intervals in the step of irradiating the substrate with laser pulses includes irradiating the substrate at a first focal position in the thickness direction with a first laser pulse having a first pulse-energy; and after irradiating with the first

(12) United States Patent
Yamamoto et al.

(10) Patent No.: US 11,289,621 B2
(45) Date of Patent: Mar. 29, 2022

(54) METHOD FOR PRODUCING SEMICONDUCTOR LIGHT EMITTING ELEMENT

(71) Applicants: NICHIA CORPORATION, Anan (JP); IMRA AMERICA, INC., Ann Arbor, MI (US)

(72) Inventors: Minoru Yamamoto, Anan (JP); Naoto Inoue, Anan (JP); Hiroaki Tamemoto, Anan (JP); Yoshitaka Hotta, Anjo (JP); Hideyuki Ohtake, Ann Arbor, MI (US)

(73) Assignees: NICHIA CORPORATION, Anan (JP); IMRA AMERICA, INC., Ann Arbor, MI (US)

( * ) Notice: Subject to any disclaimer, the term of this patent is extended or adjusted under 35 U.S.C. 154(b) by 121 days.

(21) Appl. No.: 16/768,029

(22) PCT Filed: Nov. 26, 2018

(86) PCT No.: PCT/JP2018/043455
§ 371 (c)(1),
(2) Date: May 28, 2020

(87) PCT Pub. No.: WO2019/107320
PCT Pub. Date: Jun. 6, 2019

(65) Prior Publication Data
US 2020/0365758 A1    Nov. 19, 2020

Related U.S. Application Data

(60) Provisional application No. 62/592,299, filed on Nov. 29, 2017.

(51) Int. Cl.
*H01L 21/00* (2006.01)
*H01L 33/00* (2010.01)
(Continued)

(52) U.S. Cl.
CPC ...... *H01L 33/0095* (2013.01); *B23K 26/0006* (2013.01); *B23K 26/0624* (2015.10); *B23K 26/359* (2015.10); *B23K 2103/56* (2018.08)

(58) Field of Classification Search
CPC ... H01L 21/786; H01L 33/0095; H01L 33/06; H01L 33/42; B23K 26/0006;
(Continued)

(56) References Cited

U.S. PATENT DOCUMENTS 7,749,867 B2    7/2010 Fukuyo et al.
8,263,479 B2    9/2012 Fukuyo et al.
(Continued)

FOREIGN PATENT DOCUMENTS

CN    106410573 A    2/2017
JP    H05-057464 A    3/1993
(Continued)

OTHER PUBLICATIONS

International Search Report and Written Opinion of the International Searching Authority issued in corresponding International Application No. PCT/JP2018/043455, dated Feb. 19, 2019.
(Continued)

*Primary Examiner* — Brook Kebede
(74) *Attorney, Agent, or Firm* — Foley & Lardner LLP (57) ABSTRACT

A method includes preparing a wafer including a substrate and a semiconductor structure, and irradiating an inner portion of the substrate at a predetermined depth in a thickness direction a plurality of times with laser pulses at a first time interval and a predetermined distance interval between irradiations. Each irradiation performed at the first time intervals in the step of irradiating the substrate with laser pulses includes irradiating the substrate at a first focal position in the thickness direction with a first laser pulse having a first pulse-energy; and after irradiating with the first
(Continued)

laser pulse, irradiating the substrate with a second laser pulse performed after a second time interval, the second time interval being shorter than the first time interval and being in a range of 3 ps to 900 ps, and the second laser pulse having a second pulse-energy 0.5 to 1.5 times the first pulse-energy.

19 Claims, 11 Drawing Sheets

(51) Int. Cl.
  *B23K 26/0622* (2014.01)
  *B23K 26/359* (2014.01)
  *B23K 26/00* (2014.01)
  *B23K 103/00* (2006.01)

(58) Field of Classification Search
  CPC .... B23K 26/0624; B23K 26/50; B23K 26/53; B23K 26/359
  USPC .......................................................... 438/33
  See application file for complete search history.

(56) References Cited

U.S. PATENT DOCUMENTS

| | | |
|---|---|---|
| 2005/0115930 A1 | 6/2005 | Tanaka et al. |
| 2010/0025387 A1* | 2/2010 | Arai .................... B29C 65/1635 219/121.69 |
| 2012/0064695 A1 | 3/2012 | Boyle et al. |
| 2013/0026153 A1 | 1/2013 | Ide et al. |
| 2015/0214439 A1 | 7/2015 | Herner |
| 2017/0098733 A1* | 4/2017 | Tamemoto ............. H01L 33/32 |

FOREIGN PATENT DOCUMENTS

| | | |
|---|---|---|
| JP | 2006-245043 A | 9/2006 |
| JP | 2013-146747 A | 8/2013 |
| JP | 2014-090011 A | 5/2014 |
| JP | 2015-115483 A | 6/2015 |

OTHER PUBLICATIONS

Misawa, "Nano-fabrication of transparent materials by focused-femtosecond laser beam", New Glass, 2001, pp. 38-41, vol. 16, No. 3. Partial Translation.

Sakakura et al., "Modulation of Crack Generation inside a LiF Single Crystal Interference of Laser Induced Stress Waves", Journal of Laser Micro/Nanoengineering, 2014, pp. 15-18, vol. 9, No. 1.

Sundaram et al., "Inducing and probing non-thermal transitions in semiconductors using femtosecond laser pulses", Nature Materials, Dec. 2002, pp. 217-224, vol. 1, 2002 Nature Publishing Group.

* cited by examiner

| | PULSE INTERVAL | CRACK EXTENSION LEVEL | PROCESS-POCKED SUBSTRATE IMAGE(150mW) |
|---|---|---|---|
| COMPARATIVE EXAMPLE 1 | — SINGLE | C | |
| EXAMPLE 1 | 3ps | B | |
| EXAMPLE 2 | 10ps | B | |
| EXAMPLE 3 | 50ps | B | |
| EXAMPLE 4 | 90ps | A | |
| EXAMPLE 5 | 200ps | A | |
| EXAMPLE 6 | 340ps | A | |

| | BACKSIDE CRACK |
|---|---|
| EXAMPLE 11 | |
| EXAMPLE 12 | |

METHOD FOR PRODUCING SEMICONDUCTOR LIGHT EMITTING ELEMENT

CROSS-REFERENCE TO RELATED APPLICATIONS

The present application claims priority under 37 U.S.C. § 371 to International Patent Application No. PCT/JP2018/043455, filed Nov. 26, 2018, which claims priority to and the benefit of U.S. Patent Provisional Application No. 62/592,299, filed on Nov. 29, 2017. The contents of these applications are hereby incorporated by reference in their entireties.

BACKGROUND OF THE INVENTION

1. Field of the Invention

The present disclosure relates to a method of manufacturing semiconductor light emitting elements, and more specifically relates to a method of irradiating an inner portion of the wafer with laser light to separate the wafer into semiconductor light emitting element chips or dies.

2. Description of the Related Art

Semiconductor light emitting elements are compact, have a high electric efficiency, and emit bright colors. In addition, burning-out of a light bulb is not a concern for semiconductor light emitting elements. Semiconductor light emitting elements have good initial power-up characteristics and the ability to withstand vibration and on-off cycle repetition. With these good characteristics, semiconductor light emitting elements such as light emitting diodes (subsequently referred to as LEDs) and laser diodes (LDs) are used as light sources in various applications. Notably, in recent years attention has turned to semiconductor light emitting elements as a low power-consumption, long-life, next-generation light source alternative to fluorescent lamps, and this has fueled demand for further improvement of emission efficiency and light output.

In formation of these types of semiconductor light emitting elements, semiconductor layers are epitaxially grown on a sapphire wafer and then separation into individual chips is carried out. In a conventional technique, a wafer having semiconductor layers formed on a substrate was separated into chips by using methods such as dicing, scribing, or laser scribing. In the case of using nitride semiconductor for the semiconductor layers, materials such as sapphire and SiC are used for substrates for epitaxial growth.

As a method of cleaving a wafer having a sapphire substrate, a method has been proposed (e.g. Japanese Laid-Open Patent Publication No. 2006-245043) for cleaving the wafer after irradiating an inner portion of the sapphire substrate with laser beam. In addition, burst-pulse laser with intervals of nanoseconds has been used to process the surface of the substrate.

However, when a wafer having semiconductor layers epitaxially grown on a sapphire substrate is irradiated with a high-energy laser beam, the semiconductor structures may be damaged to reduce yield.

One object of the present invention is to provide a method of manufacturing a semiconductor light emitting element in which laser scribing can be efficiently performed.

SUMMARY OF THE INVENTION

One embodiment of the method of manufacturing a semiconductor light emitting element of the present invention includes preparing a wafer including a substrate and a semiconductor structure on the substrate, and irradiating an inner portion of a substrate of the wafer at a predetermined depth in a thickness direction a plurality of times with laser pulses at a first time interval and a predetermined distance interval between irradiations. Each irradiation performed at the first time intervals in the step of irradiating the substrate with laser pulses includes irradiating the substrate at a first focal position in the thickness direction with a first laser pulse having a first pulse-energy; and after irradiating with the first laser pulse, irradiating the substrate with a second laser pulse performed after a second time interval, the second time interval being shorter than the first time interval and being in a range of 3 ps to 900 ps, and the second laser pulse having a second pulse-energy 0.5 to 1.5 times the first pulse-energy.

In the manner described above, with laser irradiation at first time intervals divided into a plurality of pulses, the intensity of each pulse (i.e. first pulse-energy and second pulse-energy) can be reduced compared to conventional laser irradiation techniques. Accordingly, the possibility of causing damage to the semiconductor layers can be reduced, and a yield-improved method of manufacturing a semiconductor light emitting element can be realized.

In another embodiment of the method of manufacturing a semiconductor light emitting element, the second laser pulse in the step of irradiating the substrate with a second laser pulse can have a second pulse-energy 0.8 to 1.2 times the first pulse-energy.

In even another embodiment of the method of manufacturing a semiconductor light emitting element, the second time interval can be in a range of 3 ps to 500 ps, and preferably 50 ps to 350 ps.

In still another embodiment of the method of manufacturing a semiconductor light emitting element, the pulse-width of the first laser pulse and the second laser pulse can be in a range of 100 fs to 10000 fs.

In yet another embodiment of the method of manufacturing a semiconductor light emitting element, the first time interval can be in a range of 5 μs to 40 μs.

In further another embodiment of the method of manufacturing a semiconductor light emitting element, the first pulse-energy of the first laser pulse can be in a range of 0.5 μJ to 15 μJ.

In still yet another embodiment of the method of manufacturing a semiconductor light emitting element, the substrate can be a sapphire substrate.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings. However, the embodiments and embodiments which will be described below are specific examples for giving a concrete form to the technical idea of the present invention, and the present invention is not limited to the descriptions below. Further, properties such as the size and positional relationships of components shown in the figures may be exaggerated for the purpose of clear explanation. In subsequent descriptions, components with the same name or reference numeral indicate components that are the same or have the same properties and their detailed description is appropriately omitted. Further, a single component can serve multiple functions and a plurality of structural elements of the invention can be implemented with the same component. In contrast, the functions of a single component can be separated and implemented by a plurality of components. Description in one example or one embodiment may be applied in another example or embodiment. In the descriptions below, terms indicating specific directions and positional relationships (e.g. upper, lower, left, right, and terms including those positional relation terms) are employed as necessary.

First Embodiment

The first embodiment of the present invention will be described below.

Semiconductor Light Emitting Element 10

First, general description of a semiconductor light emitting element 10 produced by using the method of manufacture according to the first embodiment of the present invention is given below.

Figure 1:
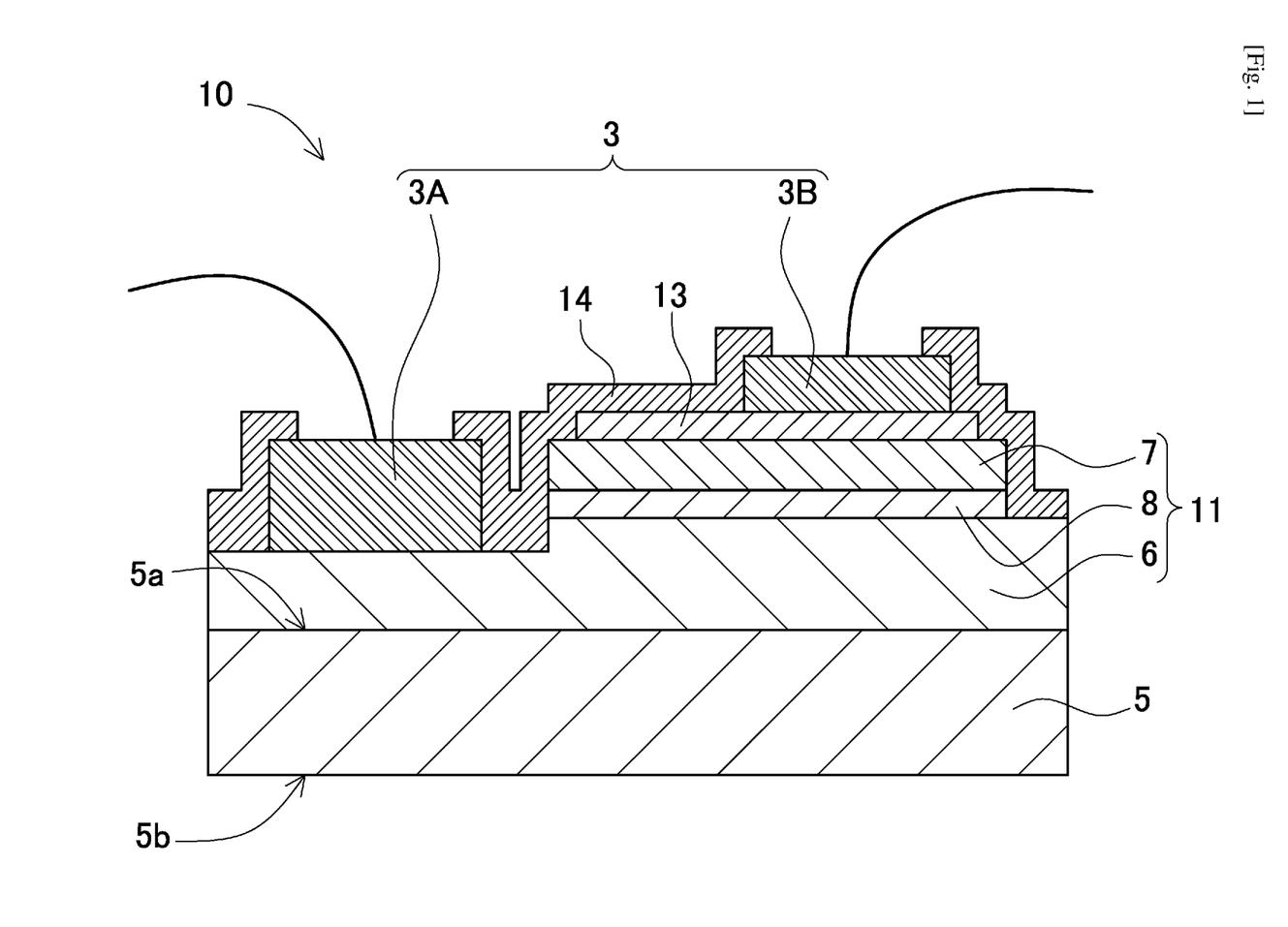
FIG. 1 is a cross-sectional view schematically showing a semiconductor light emitting element according to one embodiment of the present invention.

A cross-sectional view of the semiconductor light emitting element 10 is shown in FIG. 1. As shown in FIG. 1, the semiconductor light emitting element 10 includes a substrate 10 having a pair of primary surfaces, i.e., a first primary surface 5a and a second primary surface 5b, opposite to each other, and a semiconductor structure 11, which is nitride semiconductor layers layered on the first primary surface 5a (front-side) of the substrate 5. More specifically, the semiconductor light emitting element 10 includes a semiconductor structure 11 including an n-type first semiconductor layer 6, an active layer 8, and a p-type second semiconductor layer 7 stacked in that order on the first primary surface 5a of the substrate 5 (i.e. front-surface side). In addition, the n-type semiconductor layer is electrically connected to an n-side electrode pad 3A, and the p-type semiconductor layer is electrically connected to a p-side electrode pad 3B. When electricity from an external source is supplied to the n-side electrode pad 3A and p-side electrode pad 3B, the active layer 8 of the semiconductor light emitting element 10 emits light. Light is primarily extracted from a surface where the electrode pads 3A, 3B are formed, and from the second primary surface 5b (i.e., back-surface side). The active layer 8 corresponds to a light emitting layer, and for example, the light emitted by the active layer 8 has a peak emission wavelength of 360 nm (nanometers) to 650 nm.

A light-transmitting conducting layer 13 is disposed on the p-type semiconductor layer, and the p-side electrode pad 3B is dispose on the light-transmitting conducting layer 13. Further, only a predetermined region of the n-side electrode pad 3A and a predetermined region of the p-side electrode pad 3B are exposed, while other regions are covered by an electrically insulating passivation layer 14.

Method of Manufacturing a Semiconductor Light Emitting Element

Next, the method of manufacturing a semiconductor light emitting element 10 is described.

Providing Wafer

A wafer in which the semiconductor structures 11 is disposed on the first primary surface 5a of the substrate 5 is provided. The substrate 5 is a growth substrate on which the semiconductor structure 11 can be grown, and may have any appropriate size and thickness. For the substrate 5, materials that transmit light emitted from the semiconductor stack, electrically insulating and light-transmitting materials such as sapphire ($Al_2O_3$), SiC, or spinel ($MgAl_2O_4$) or semiconducting materials (e.g. nitride-based semiconductor materials) can be used.

Although sapphire is a material that does not easily propagate cracks, the method according to the present embodiment allows for propagating cracks even in a sapphire substrate. Further, the thickness of the sapphire substrate 5 can be in a range of, for example, 50 μm (microns) to 2 mm (millimeters). It is also possible for sapphire substrate 5 to have a thickness in a range of approximately 200 μm to 2 mm until formation of semiconductor structure 11 and electrode pads, and subsequently thinned by processing such as polishing to have a thickness in a range of approximately 50 µm to 1 mm, and preferably 100 µm to 500 µm.

As an example of a semiconductor structure 11 grown on the first primary surface 5a of the substrate 5, a structure in which first semiconductor layer 6 (e.g. n-type semiconductor layer), active layer 8 (light emitting layer), and second semiconductor layer 7 (e.g. p-type semiconductor layer) are layered in order from a substrate 5 side is preferable in view of output and efficiency. However, the semiconductor structure 11 is not limited to have that configuration, and may alternatively have another structure.

For semiconductors that can emit ultra-violet light or visible light in a range of blue to green light, for example, materials such as III-V group compound semiconductors or II-VI group compound semiconductors can be used. More specifically, nitride-based semiconductors such as $In_xAl_yGa_{1-x-y}N$, ($0<=x$, $0<=y$, $x+y<=1$) (e.g. InN, AlN, GaN, InGaN, AlGaN, and InGaAlN) can be employed. Because nitride semiconductors emit visible light in a shorter wavelength range, near ultraviolet range, or even shorter wavelength range, white light can be obtained easily by combining light from the semiconductor structure 11 and light converted by wavelength-converting (phosphor or fluorescent) materials. Further, when the substrate 5 is a sapphire substrate, it is easy to grow semiconductor structures 11 made of nitride semiconductor material.

The semiconductor layers are grown using any appropriate method, and any appropriate methods known as a method for growing semiconductor such as MOCVD (metal organic chemical vapor deposition), MOVPE (metal organic vapor phase epitaxy), or HVPE (hydride vapor phase epitaxy) can be preferably employed. In particular, MOCVD is desirable because it can epitaxially grow material with good crystallinity.

After growing semiconductor structure 11 and prior to laser processing, a step of thinning the substrate 5 can be performed. To thin the substrate 5, polishing or grinding of the substrate 5 is performed at the second primary surface 5b (backside).

Cleaving

Figure 2:
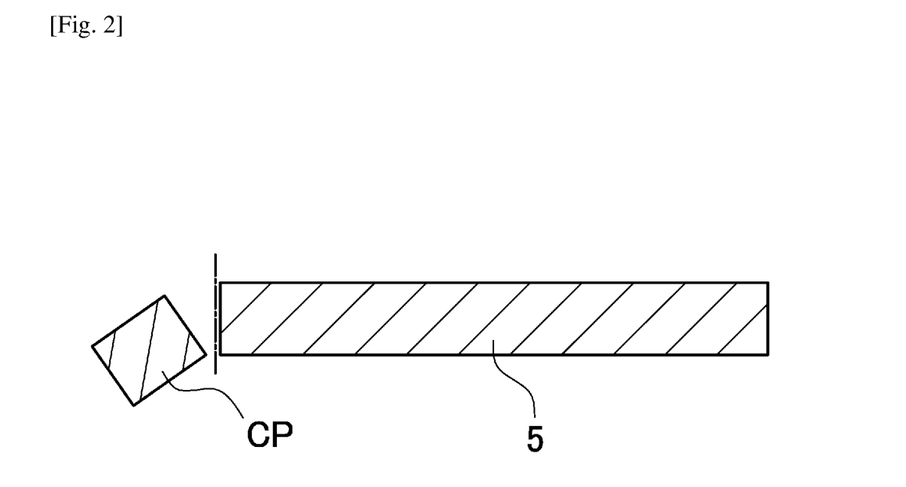
FIG. 2 is a cross-sectional view schematically showing a semiconductor light emitting element chip cleaved from a wafer.

After growing semiconductor structure 11, the substrate 5 is cleaved to singulate into each chip CP as illustrated in FIG. 2. In the cleaving, an inner portion of the substrate 5 is irradiated with a laser beam LB, which embrittle a portion of the substrate 5 to be a modified region (where material properties of the substrate crystal are altered) are formed. This is illustrated in the schematic cross-sectional view in FIG. 3.

Laser Beam LB

For a laser light source emitting the laser beam LB, a pulsed laser can be used. The laser beam LB has any appropriate wavelength, and for example, a laser having a wavelength in the range of 800 nm to 1100 nm can be used. More specifically, various lasers such as a titanium-sapphire laser, Nd:YAG (neodymium-doped yttrium aluminum garnet) laser, Nd:YVO$_4$ (neodymium-doped yttrium orthovanadate) laser, YLF (yttrium lithium fluoride) laser, and ytterbium-doped fiber laser can be used. In addition, higher order harmonics generated from those lasers can also be used. A pulsed laser having a pulse-width in the femtosecond order to picosecond order can be used to for the laser beam LB, and specifically, a laser with a pulse-width from 100 fs to 10000 fs can be used. An ytterbium-doped fiber laser with a peak emission wavelength at 1045 nm is used in the first embodiment. A high-output pulsed laser can efficiently irradiate the inside of the substrate 5, it can be used with good results to establish material modified regions in the substrate.

Figure 17:
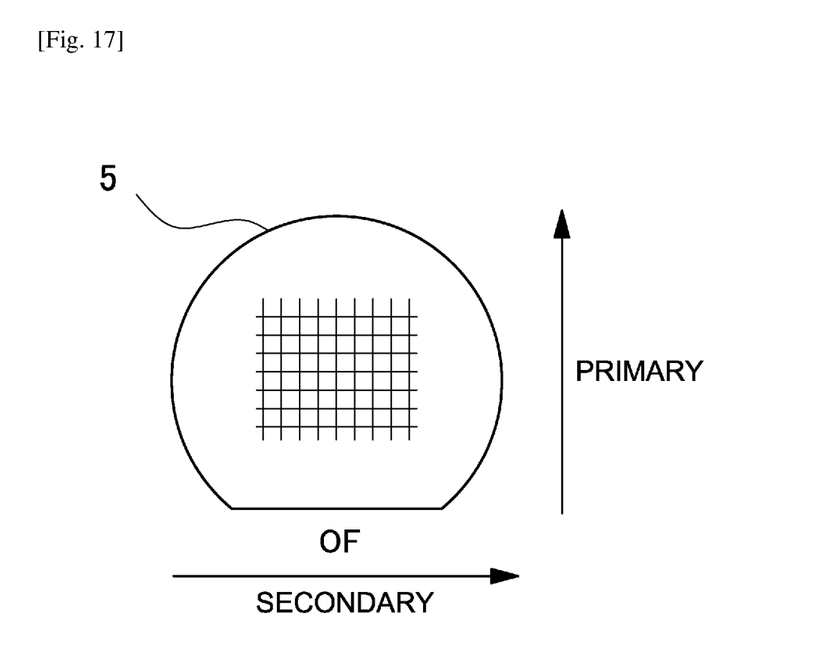
FIG. 17 is a plan view schematically showing laser scanning directions on the substrate.

The scanning of the laser beam LB in the laterally-extending plane is performed along lines where the wafer is to be broken apart (imaginary cleaving lines). The plan view in FIG. 17 illustrates one example of laser beam scanning directions. In FIG. 17, a direction approximately perpendicular to the wafer orientation flat OF (e.g. sapphire crystal a-plane) is taken as the primary direction, and the approximately horizontal direction is taken as the secondary direction. Laser scanning is performed in the secondary direction, and subsequently performed in the primary direction.

Figure 3:
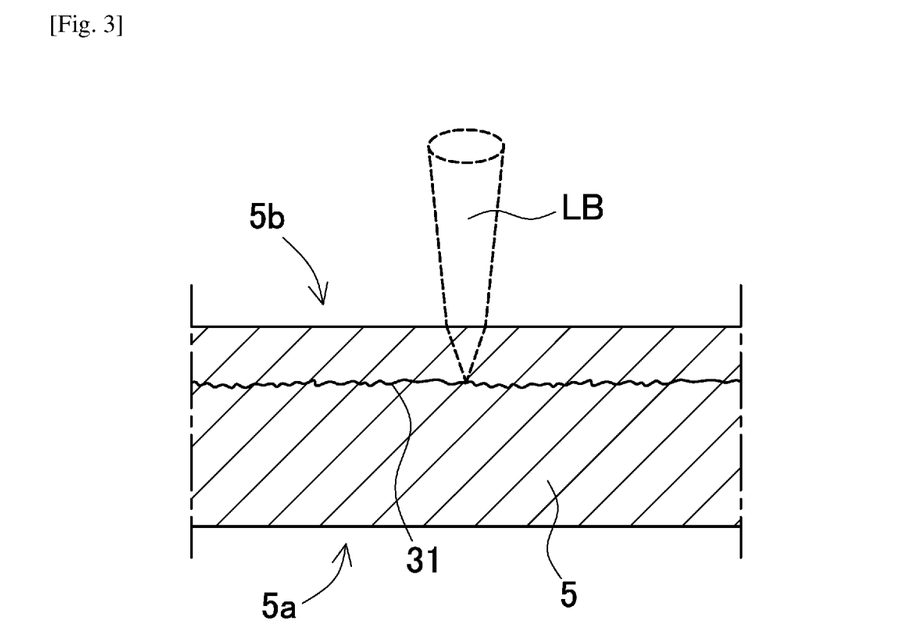
FIG. 3 is a cross-sectional view schematically showing laser irradiation from the backside of the substrate down to the first focal position.
Figure 4:
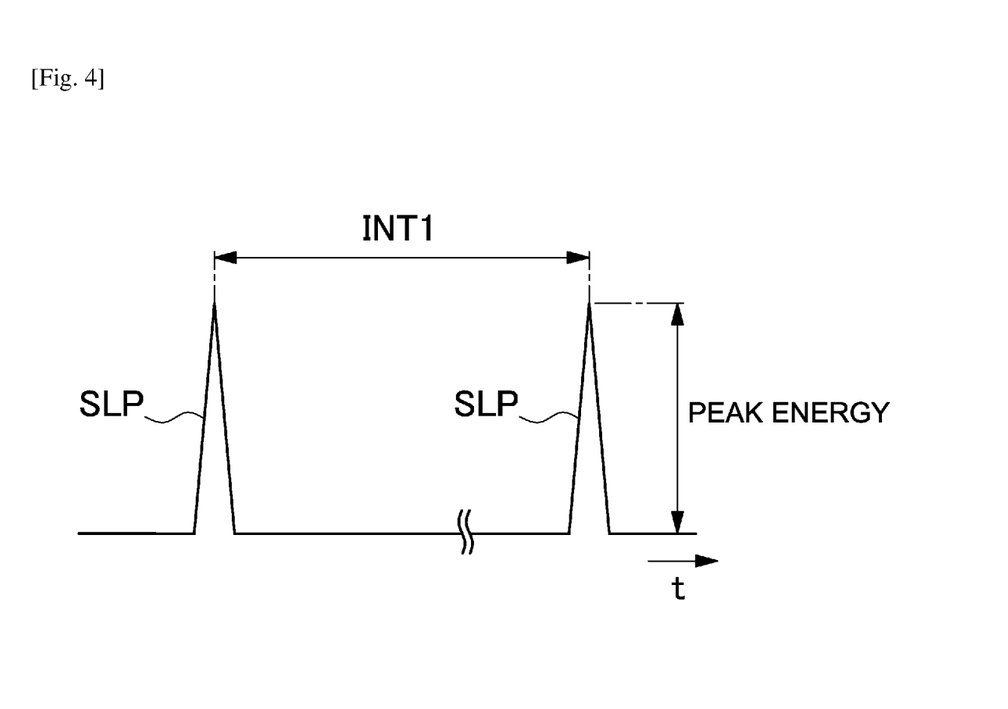
FIG. 4 is a time plot showing an example of a laser pulse pattern in a related art.
Figure 5:
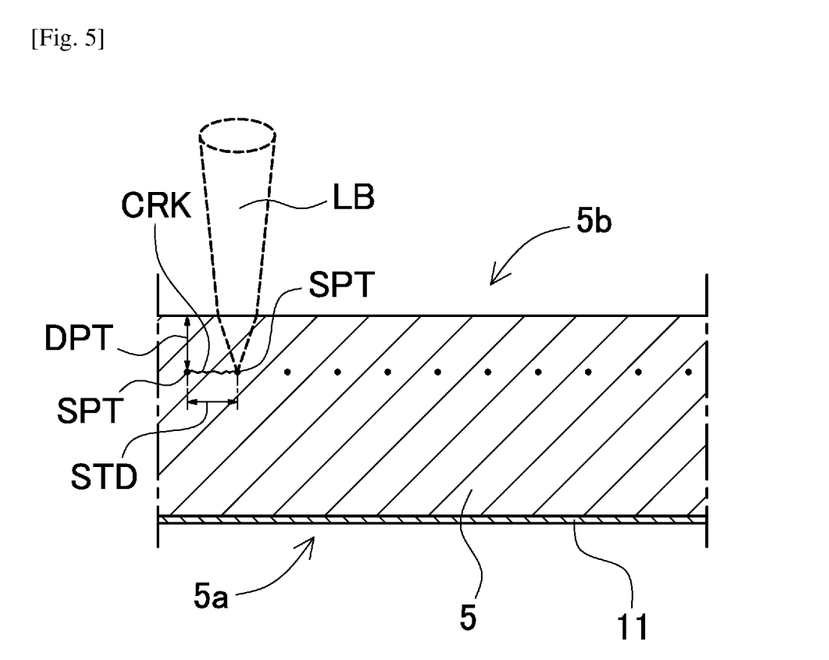
FIG. 5 is a cross-sectional view schematically showing laser focal position in a related art.

As shown in FIG. 3, using a laser processing machine with a pulsed laser having femtosecond to picosecond pulse-width, a laser beam LB is irradiated toward inside of the substrate 5 from a backside surface side of the substrate 5. The laser beam LB is irradiated to the first focal position 31 in the thickness direction of the substrate 5. In a laser processing in a related art shown in FIG. 4, pulsed laser beam (i.e., single pulses SLP) separated by a constant time interval (first time interval INT1) is irradiated to the substrate 5 to generate cracks. More specifically, as shown in FIG. 5, laser beams are focused at a predetermined depth DPT in the thickness direction of the substrate 5 (in an upper-lower direction in FIG. 5) to form laser marks or spots SPT with a constant distance interval STD between spots SPT and propagate cracks between adjacent spots SPT. Because sapphire has a hexagonal crystal structure, cracks can easily propagate along a-planes of the sapphire. Accordingly, in the case of using a sapphire substrate for the substrate 5, semiconductor structures are epitaxially grown on a c-plane of the sapphire substrate.

However, because the laser beam has a high energy, damage to semiconductor structures formed on the front-side of the substrate is a concern even when the laser beam is introduced from the backside. Damage sustained by the semiconductor structures may be a cause of device rejection (failure), which may reduce yield. On the other hand, if intensity of a laser beam is reduced, sufficient propagation of cracks may not be achieved, so that the substrate may not break in the desired directions during cleaving, which may also induce reduction in yield. Thus, for a semiconductor manufacturing method that employs laser scribing, there is a trade-off between protecting the semiconductor structures and achieving sufficient laser scribing to cleave the wafer.

Figure 6:
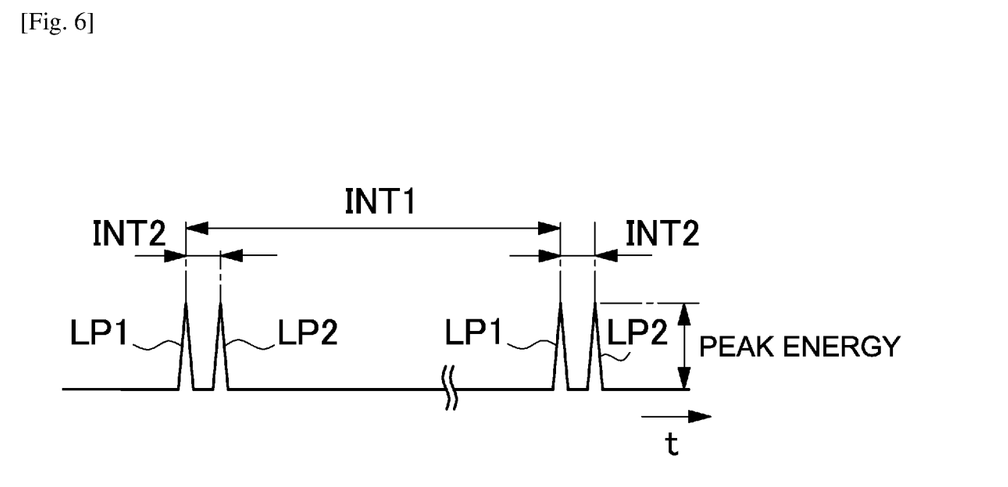
FIG. 6 is a time plot showing a laser pulse pattern example according to one embodiment of the present invention.
Figure 7:
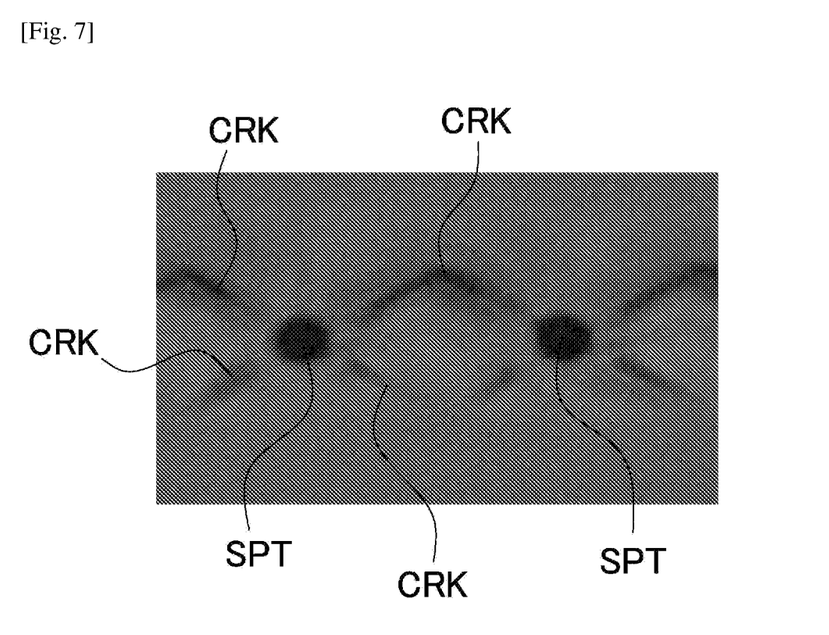
FIG. 7 is an optical microscope photograph showing an example of cracks and portions irradiated with laser.
Figure 8:
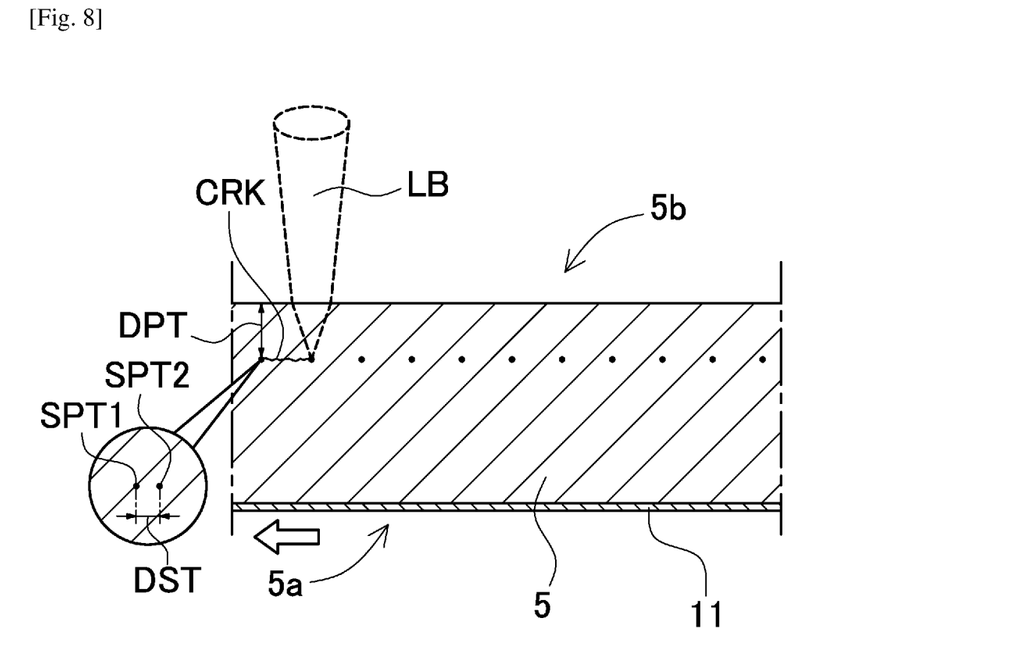
FIG. 8 is a cross-sectional view schematically showing laser focal spot location for an embodiment of the present invention.

This problem was investigated by the present inventors, and after repeated trial-and-error, the present inventors has found a method of sufficiently generating and controlling crack propagation while reducing intensity of a single pulse of a laser beam. More specifically, inventors found that dividing each laser pulse shown in FIG. 4 into a plurality of pulses, as shown in FIG. 6, and setting the intensity ratio of those pulses LPT1, LPT2 to 1:(1±0.5) allows for obtaining sufficient crack propagation, and thus the present invention was made. That is, while the process of laser irradiation in pulse form at first time intervals INT1 was retained, irradiation with a plurality of separate pulses LP1, LP2 of reduced intensity as shown in FIG. 6 was performed instead of irradiation with a single large pulse (SLP). This technique was successful in sufficiently propagating and controlling cracking while reducing adverse effects of irradiation on the semiconductor layers. An example of laser marks (spots) SPT and cracks CRK produced by this technique is shown in FIG. 7. FIG. 7 is a photograph taken from the backside of the substrate.

As shown in FIG. 6, each laser irradiation includes a first laser pulse LP1 and a second laser pulse LP2. It is desirable for the intensity of the first laser pulse LP1 and the second laser pulse LP2 to be approximately equal. For obtaining a processing performance similar to that of the conventional technique shown in FIG. 4, the same total irradiation energy can be achieved by dividing the single pulse into approximately equal energy pulses having reduced energy. However, the first laser pulse LP1 and the second laser pulse LP2 do not have to be identical, and for example, the intensity ratio of the first laser pulse LP1 to the second laser pulse LP2 can be 1:(1±0.2). When the magnitude of the intensity ratio significantly exceeds that value, the amount of cracking may be reduced.

The pulse-width of the first laser pulse LP1 and the second laser pulse LP2 is in a range of 100 fs to 10000 fs, preferably 200 fs to 5000 fs, and more preferably 500 fs to 1000 fs. Although it is desirable for the first laser pulse LP1 and second laser pulse LP2 to have the same pulse-width, the pulse-width may not be exactly the same and the ratio of the pulse-width of the first laser pulse LP1 to the second laser pulse LP2 can be 1:(1±0.2).

The time interval between the first laser pulse LP1 and the second laser pulse LP2, which is the second time interval INT2, is set to ¹⁄₁₀₀₀ of the first time interval INT1. The second time interval INT2 is preferably 3 ps (picoseconds) to 900 ps, more preferably 3 ps to 500 ps, and most preferably 50 ps to 350 ps. In experiments performed by the inventor, crack propagation was achieved with minimum laser output when the second time interval INT2 was set between 50 ps and 350 ps (e.g. 200 ps). When the second time interval INT2 was set below the 3 ps, propagation performance of cracks was varied and stable results could not be obtained. As shown in FIG. 6, the first time interval INT1 indicates the time from one first laser pulse LP1 to the next first laser pulse LP1, and the second time interval INT2 indicates the time from the first laser pulse LP1 to the second laser pulse LP2.

To irradiate the substrate with constant distance intervals between laser spots SPT, portions irradiated with the laser beam and substrate 5 are relatively moved from each other. For example, a plurality of laser spots SPT separated by a distance interval STD can be formed by moving the substrate 5 at constant speed while repeating irradiation of a laser beam at a predetermined position in synchrony with the moving of the substrate motion. Alternatively, the laser beam can be scanned to move laser irradiation points while holding the substrate fixed. Even alternatively, moving of the substrate and scanning of the laser beam can be performed in combination. Here, the distance interval STD between laser spots is, for example, 1 µm to 10 µm, and preferably 2 µm to 6 µm.

For example, a portion to be irradiated with the laser beam is held stationary and the substrate 5 is moved. This allows for varying, as well as the distance interval STD between spots, a distance interval DST, which is an interval between the first focal position and the second focal position in accordance with the second time interval INT2 between the first and second pulses. If the second time interval INT2 is increased, the distance DST increases, and cracks between spots separated by the distance STD become longer, which allows for increasing propagation performance of cracks in the substrate. According to the examination by the inventors, propagation performance of cracks in the substrate was most enhanced with the second time interval INT2 in the range of 50 ps to 350 ps. However, with the second time interval between pulses increased to the nanoseconds order, crack propagation decreased. With a second time interval INT2 of 200 ps, laser scribing processing was achieved even when pulse energy was reduced by approximately 60% compared to a conventional technique with the single-pulsed laser beam (pulse-width: 700 fs).

In contrast, the first time interval INT1 is 2 µs to 100 µs, and preferably 5 µs to 40 µs.

In the inventors' experiments, the pulse energy required for crack propagation by the single pulse in the conventional technique was 3.4 µJ, while that in the present embodiment could be reduced to 1.4 µJ. That is, in the present embodiment, the pulse energy required for crack propagation was reduced to 40% of that of the conventional technique, so that processing efficiency was improved. In addition, linearity of propagation of cracks was improved as well as ease of controlling crack propagation.

Laser Beam with a Picosecond Pulse Interval

Figure 9:
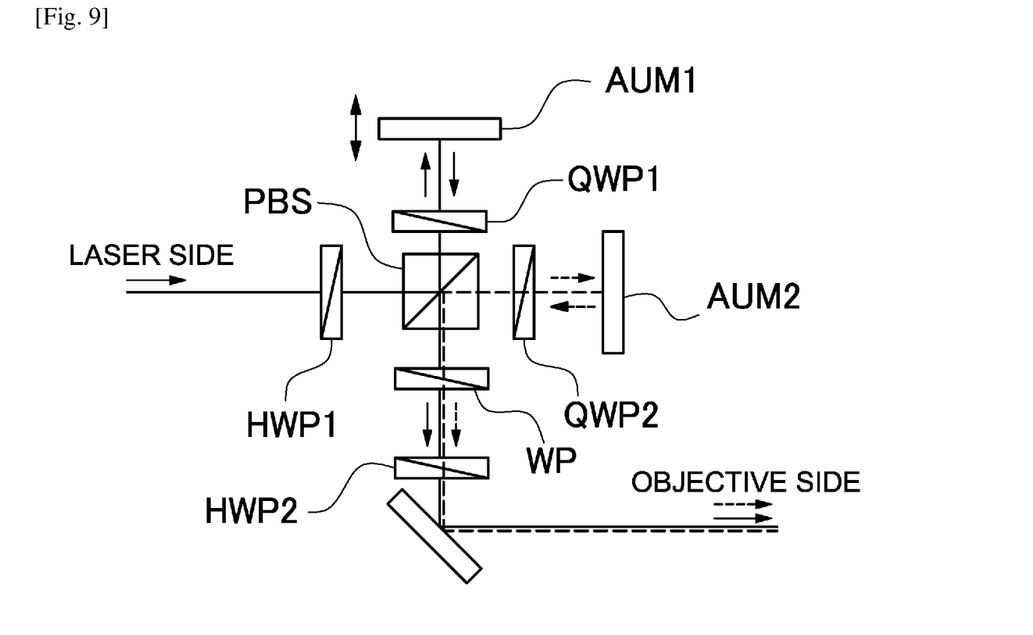
FIG. 9 is a schematic diagram showing the optical system of a Michelson interferometer.

To generate these types of laser beams with intervals between pulses of picosecond order, an instrument such as the Michelson interferometer shown in FIG. 9 can be used. The optical system of the Michelson interferometer shown in FIG. 9 divides pulses of a laser beam into a train of pulses with intervals in picosecond order between pulses. Herein, received pulsed laser beam passes through a first polarizing filter HWP1 rotating polarized laser beam 45°. A polarizing beam splitter PBS then splits the laser beam into two directions (i.e., upward and to rightward in FIG. 9). The upward reflected beam-split component (i.e. the component corresponding to the first pulse LP1) passes through a first circular polarizing filter QWP1 and is reflected at a first gold mirror AUM1. Similarly, the component that passes through the beam splitter to the right side in FIG. 9 (i.e. the component corresponding to the second pulse LP2) passes through a second circular polarizing filter QWP2 and is reflected at a second gold mirror AUM2. These reflected components are extracted after passing through the beam splitter PBS, a polarizer WP, and a second polarizing filter HWP2. A time delay is generated between components due to a difference in the length of the optical path of each component. Referring to FIG. 9, the time delay between components, which is the time delay between the first laser pulse LP1 and the second laser pulse LP2, can be adjusted by moving one of the mirrors made of gold (e.g. the first gold mirror AUM1). Specifically, the second time interval INT2 can be controlled by moving one of the first and second gold mirrors. For example, a 1 ps time difference between pulses can be established with a 0.3 mm difference in optical path length. Alternatively, when a fiber laser is used as the source of the laser beam is, with use of an optical branching element such as a wavelength division multiplexer (WDM), adjustment of a length of propagation of a plurality of pulses (fiber length) allows the time between the plurality of pulses to be controlled. Further, after optical branching, it is possible to control intervals between pulses using an optical delay device in a predetermined fiber. An in-line optical delay device is desirable.

Phenomena Induced by Irradiation with Laser Beam of Ultrashort Pulse

Figure 10:
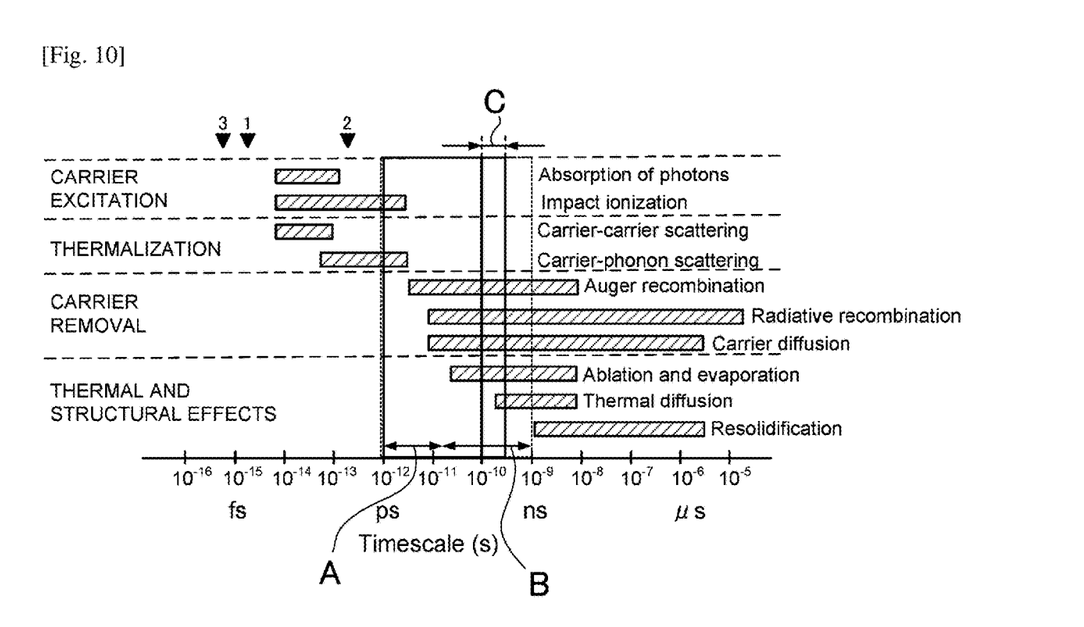
FIG. 10 is a diagram showing various mechanism occurrence in time after laser irradiation.

Phenomena induced by ultrashort first laser pulse irradiation will be described. Various mechanisms that occur qualitatively at different times after laser irradiation are examined based on FIG. 10, which charts event occurring after laser irradiation on a time scale. FIG. 10 is excerpted from FIG. 1 of the reference: S. K. Sundaram, E. Mazur, "Inducing and probing non-thermal transitions in semiconductors using femtosecond laser pulses," Nature Materials Vol. 1, pp. 217-224, December 2002. In the picosecond range ($10^{-12}$ s to $10^{-11}$ s) designated by A in FIG. 10, carrier diffusion and the transfer of thermal energy to the crystal lattice occurs following scattering between carriers (excited electron), i.e., carrier-carrier scattering, and carrier-phonon (lattice vibration) scattering. If a second pulse is introduced during this picosecond range (A), where carriers are in an excited state and carrier density exceeds normal values (i.e. in a state where multiphoton absorption is not required for excitation), electrons efficiently absorb photons to accelerate ionization and increase processing efficiency. In the next range ($10^{-11}$ s to $10^{-9}$ s) designated by B in FIG. 10, early stages of material phase transition (e.g., melting, vaporization) and nucleation occur, or explosive ablation generates stress waves leading to the initial stages of crack formation. Accordingly, if a second laser pulse is introduced during this time range (B), processing is thought to be accelerated. In particular, efficient processing can be expected for irradiation in the time range indicated by C, which is within the time range B in FIG. 10.

Figure 11:
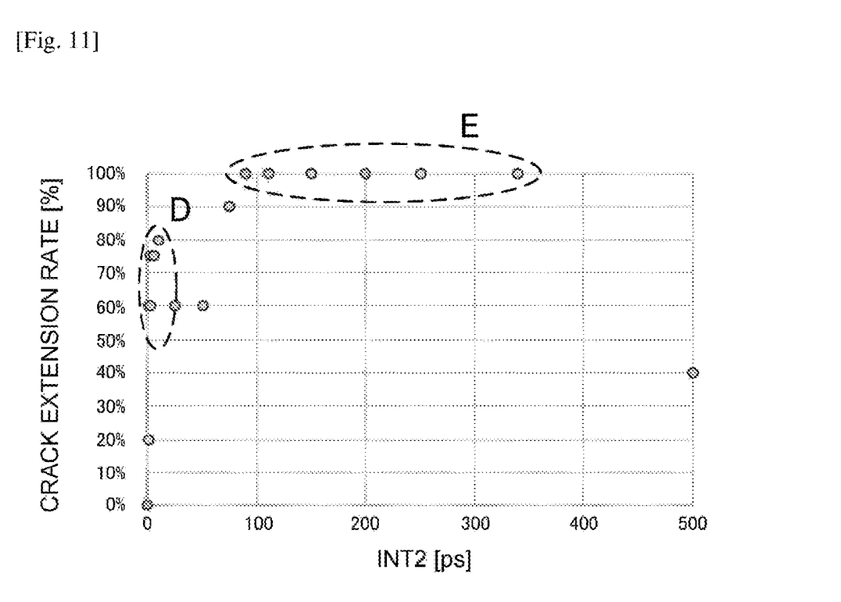
FIG. 11 is a graph showing the degree of crack propagation for different second time intervals.

Next, the graph shown in FIG. 11 indicates the percentage of crack propagation or extension as a function of the delay time between the first laser pulse and the second laser pulse (i.e. the second time interval INT2). The region of 2 ps to 10 ps, which is indicated by D in FIG. 11 and corresponds to range A in FIG. 10, is a region of initial processing improvement. In this range, the second laser pulse is introduced when the irradiated material is in an excited state with many electrons in the conduction band, which does not require multiphoton absorption. Accordingly, energy absorption is highly efficient because light energy is directly transferred to the electrons. This allows for accelerating ionization and is thought to increase processing efficiency.

The region of 90 ps to 340 ps, which is indicated by E in FIG. 11 and corresponds to range C in FIG. 10, is a favorable processing region. In this region, ionization is accelerated due to photon absorption by a portion of the residual excited carriers, which allows for increasing processing efficiency. Further, it is thought that processing can be accelerated by introducing the second laser pulse during the initial stages of material phase transition (melting, vaporization) and nucleation, or during the initial stages of crack formation due to stress waves generated by explosive ablation.

EXAMPLES

Next, as the first through sixth examples (Examples 1-6), a sapphire substrate was irradiated with laser beam with various second time intervals, and the extent of substrate cracking was observed. The laser processed marks and cracks formed on the backside of the substrate by the irradiation was captured using an optical microscope. In addition, results for single pulse irradiation were measured as Comparative Example 1. Laser marks and cracks were imaged by transmitted illumination mode optical microscopy focusing on laser irradiated regions at the first focal distance (depth). Here, a sapphire substrate with a size of four inches and a thickness of 150 µm was used. In addition, the first time interval was set to 10 µs, with pulse-width set to 300 fs. With these parameters, the second time interval between pulses was set to 3 ps for Example 1, 10 ps for Example 2, 50 ps for Example 3, 90 ps for Example 4, 200 ps for Example 5, and 340 ps for Example 6. Results are shown in the table of FIG. 12, where the extent of cracking was graded as A, B, or C (A being best and C being worst).

Figure 12:
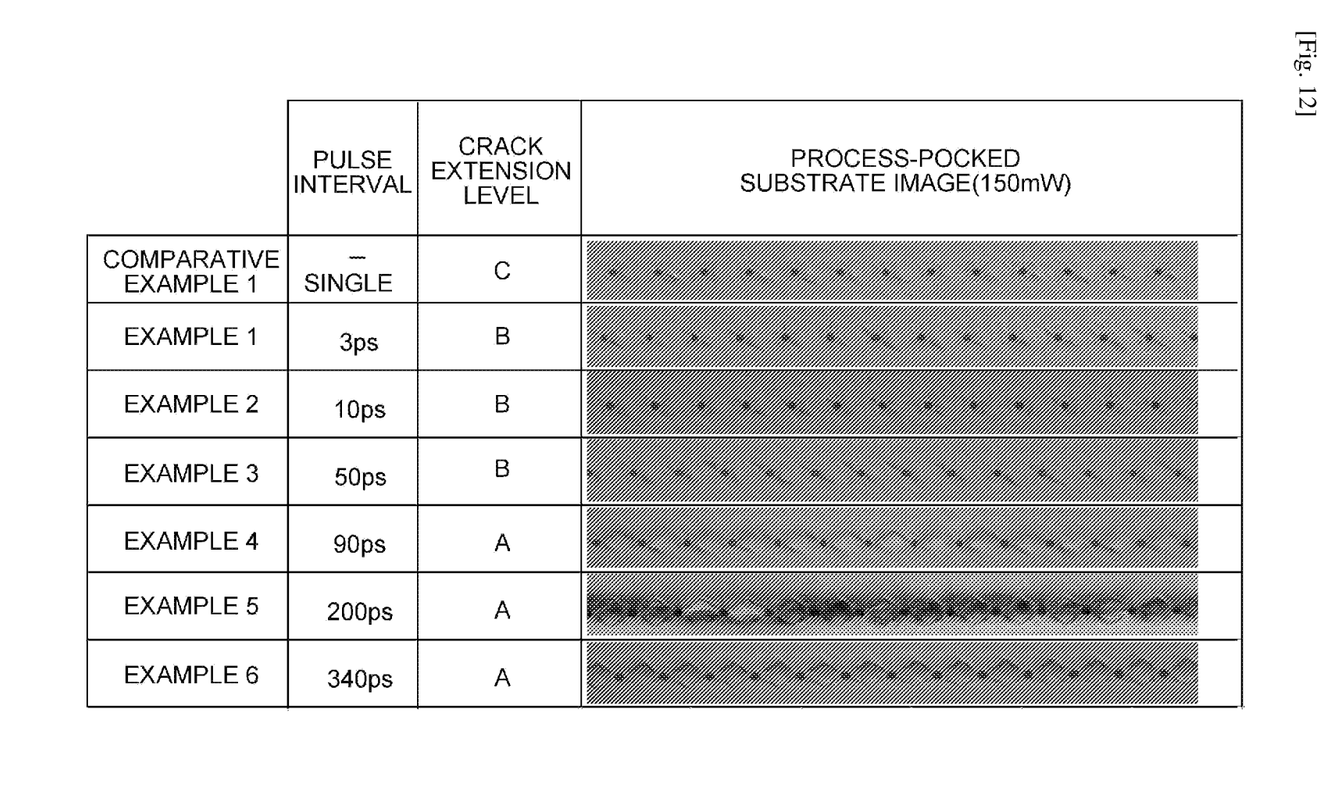
FIG. 12 is a table showing the relationship between laser mark appearance, the extension level of cracks, and the interval between laser pulses.

As shown in FIG. 12, crack propagation was observed for all of Examples 1-6, which were graded "good" as either A or B. In particular, Examples 4-6 showed the most crack propagation and were graded A. In contrast, Comparative Example 1, with single-pulse irradiation, showed very little crack propagation and was graded C.

An experiment was also performed with variation in the intensity ratio of the first pulse to the second pulse. In this experiment, processing marks and cracks were captured and observed, with an intensity ratio of a 1:1 (4:4) in Example 7, with an intensity ratio of 4:2 in Example 8, with an intensity ratio of 2:4 in Example 9, with an intensity ratio of 4:1 in Comparative Example 2, and with an intensity ratio of 1:4 in Comparative Example 3. Other parameters for Example 7 were the same as those for Example 4. Experimental results are shown in Table 1. As shown in Table 1, the best crack propagation was observed for a intensity ratio of 1:1 (i.e., balanced) in Example 7, while negligible cracking was seen for large imbalance in pulse intensity (C grade). When the intensity ratio of the first pulse to the second pulse was unbalanced with either a high or low ratio, the extent of cracking decreased as that imbalance was increased.

TABLE 1

|  | INTENSITY RATIO | CRACK EXTENSION LEVEL |
| --- | --- | --- |
| EXAMPLE 7 | 4:4 (1:1) | A |
| EXAMPLE 8 | 4:2 | B |
| EXAMPLE 9 | 2:4 | B |
| COMPARATIVE EXAMPLE 2 | 4:1 | C |
| COMPARATIVE EXAMPLE 3 | 1:4 | C |

Figure 13:
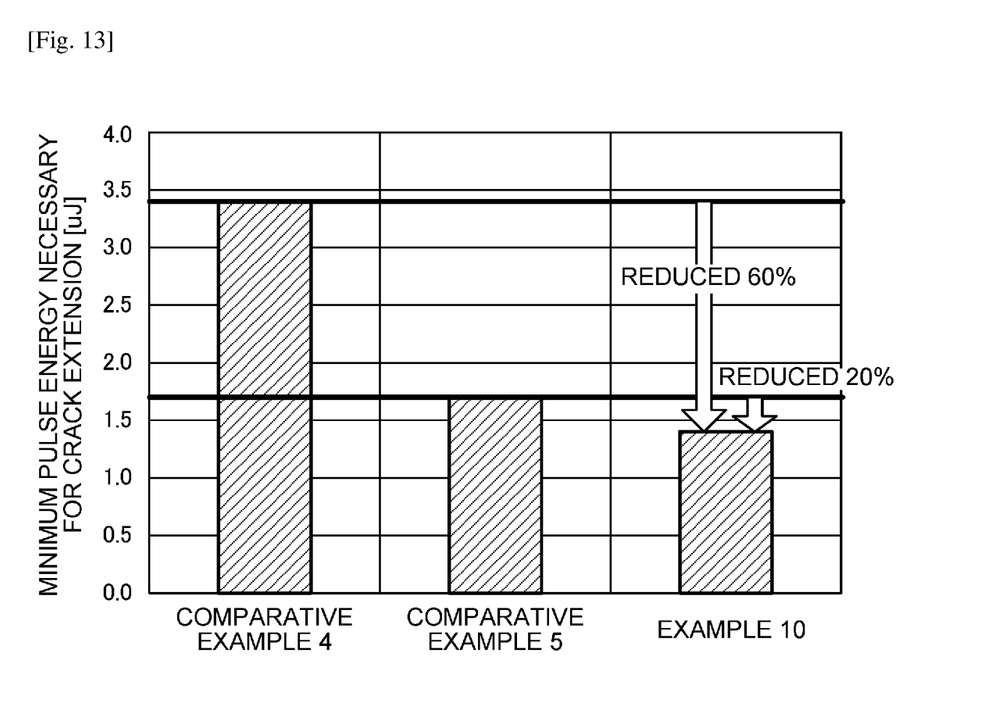
FIG. 13 is a graph showing the minimum pulse-energy required for crack propagation in a related art example and embodiments of the present invention.

Next, the minimum pulse energy necessary to produce good crack extension was investigated under various conditions. FIG. 13 is a graph showing the minimum pulse energy required for good crack propagation in Comparative Example 4, Comparative Example 5, and Example 10. Single pulse irradiation was performed in Comparative Example 4, dual pulse (divided pulse) irradiation with a nanosecond interval (20 ns) between the first and second pulses were performed in Comparative Example 5, and dual pulse irradiation with a picosecond interval between pulses (within the 3 ps to 900 ps range of the first embodiment) was performed in Example 10. Minimum crack propagation energy for Example 10 was 1.4 µJ, which was approximately 40% that of the single pulse Comparative Example 4 (3.4 µJ). This comparison indicated approximately 60% reduction in required pulse energy and confirmed that Example 10 allows for realizing a high processing efficiency. Minimum crack propagation energy for Example 10 was also 80% of that of Comparative Example 5 (1.7 µJ) with nanosecond pulse intervals representing a 20% reduction in required pulse energy, which further confirming that Example 10 allows for realizing still higher processing efficiency.

Figure 14:
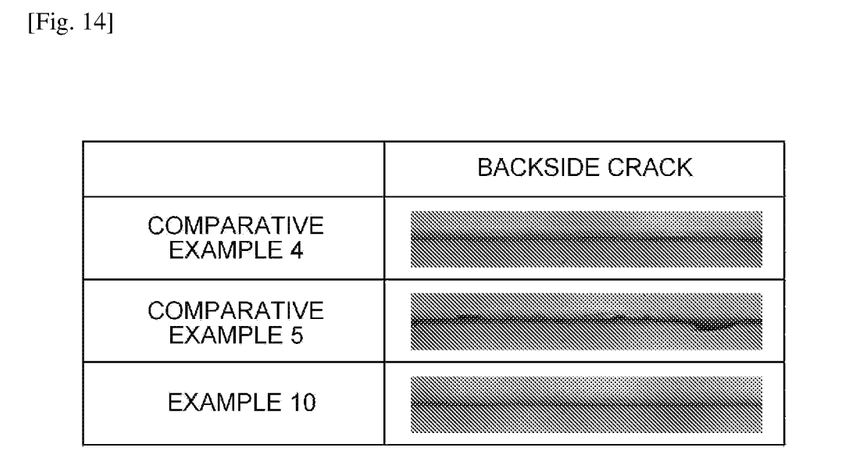
FIG. 14 is optical microscope photographs of back surface side of the substrate in a related art example and embodiments of the present invention.

As shown in FIG. 14, an appearance of cracks at a backside of the sapphire substrate was observed for the three samples as described above (i.e. Comparative Example 4, Comparative Example 5, and Example 10). The surface of the backside of the substrate was captured using an optical microscope in the transmitted illumination mode, focusing on the surface of the backside of the substrate. As shown in FIG. 14, while cracking was not in linear manner in Comparative Example 5 with the dual pulse and nanosecond intervals between the first and second pulses, linearity of cracking was maintained in Example 10 with the picosecond interval dual pulse as in Comparative Example 4 with the single pulse. Thus, it was confirmed that Example 10 allows for propagating cracks with good linearity, and realizing laser scribing with high processing efficiency. As described above, with the method of manufacturing a semiconductor light emitting element according to the examples, laser irradiation was separated by first time intervals into a plurality of pulses with an interval of 3 ps to 900 ps between pulses. Compared to the background technology, this allows for reducing concern regarding damage to the semiconductor layers and realizing a method of manufacturing a semiconductor light emitting element that can improve yield. Accordingly, a margin with respect to semiconductor layer damage can be increased.

Figure 15:
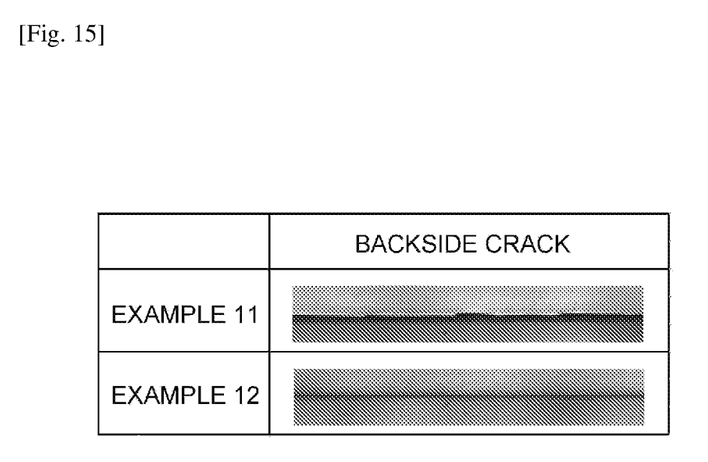
FIG. 15 is optical microscope photographs of substrate backside cracking for different pulse width embodiments.

As shown in FIG. 15, the relationship between sapphire substrate backside cracking and the pulse-width of the first laser pulse LP1 and second laser pulse LP2 in the present example was investigated via optical microscope photographs. In Example 11, a pulse-width was 300 fs, and in Example 12, a pulse-width was 700 fs. Other parameters were: second time interval of 200 ps between first and second pulses, and a intensity ratio of the first laser pulse to the second laser pulse of 1:1. Results showed that, in Example 12 with the 700 fs pulse-width, cracking was propagated in a more linear manner.

Figure 16A:
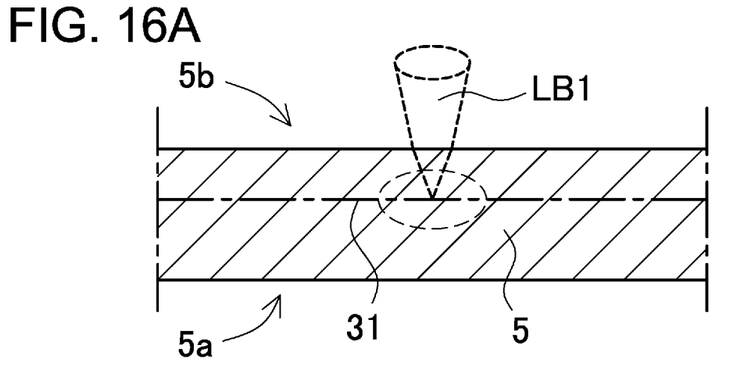
FIG. 16A is a cross-sectional view schematically showing first laser scan irradiation from the backside of the substrate down to the first focal position.
Figure 16B:
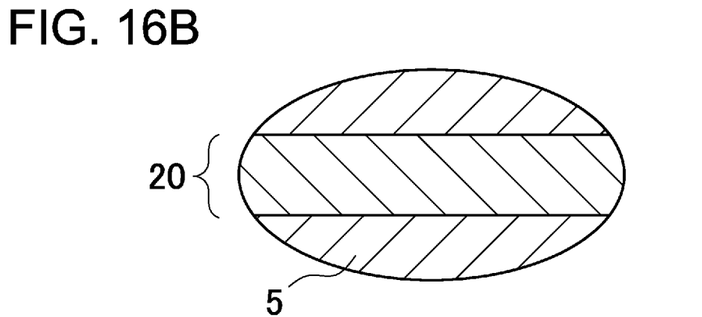
FIG. 16B shows a schematic enlarged view of the cross-sectional view in FIG. 16A.
Figure 16C:
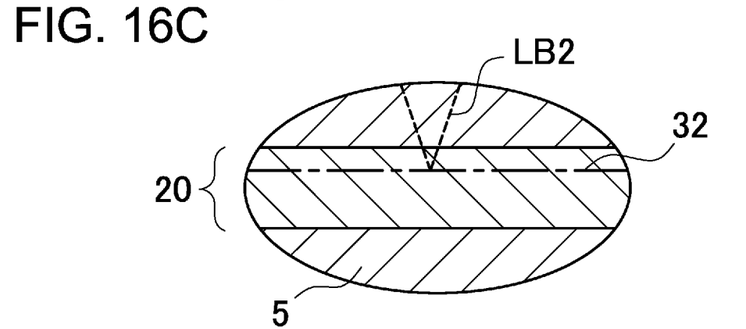
FIG. 16C is a cross-sectional view schematically showing second laser scan irradiation at the second focal level within the laser-processed region of FIG. 16B.
Figure 16D:
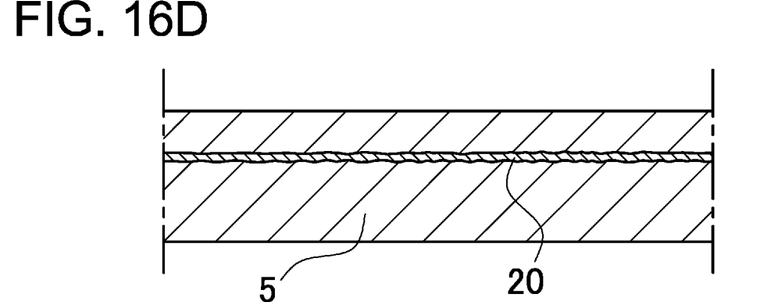
FIG. 16D is a cross-sectional view schematically showing crack propagation after the processing shown in FIG. 16C.

In the examples described above, laser irradiation was performed at predetermined intervals while scanning parallel to the primary surfaces of the substrate 5, and irradiation was at a constant depth in the thickness direction of the substrate 5. However, the scope of the present invention is not limited to that procedure, and instead of irradiation at a single constant depth, the laser can also be scanned twice at different depths in the thickness direction of the substrate 5. In particular, as shown in the schematic cross-sectional views of FIGS. 17A-17D, crack propagation can be further enhanced by focusing the beam for a second laser scan within the modified region formed by the first laser scan at the first focal position. In this case, as shown in FIG. 16A, with the wafer in which the semiconductor structures 11 is formed on the front-side (first primary surface 5a) of the substrate 5, the laser beam LB1 for the first laser scan is focused at a first focal position 31 in the thickness direction of the substrate 5, and irradiation is introduced from the backside (second primary surface 5b) of the substrate 5. Position where the laser beam LB1 for the first laser scan is to be focused is adjusted to be at the first focal level 31. A modified region is formed around each of portions where laser beam LB1 is focused, and by scanning the laser beam LB1 horizontally, the modified region 20 is formed as a band. This irradiation is referred to as "a first laser irradiation." As shown in the enlarged cross-sectional view in FIG. 16B, with the first laser irradiation, the modified region 20 is formed. Next, as shown in FIG. 16C, the laser beam LB2 for the second laser scan is focused at a second focal position 32, which is within the modified region 20 at a depth in the thickness direction of the substrate 5 different from that of the first focal position 31. This irradiation is referred to as "a second laser irradiation." With the second laser irradiation, crack extension is accelerated, and the time required for cracks to extend to the backside (second primary surface 5b) of the substrate 5 can be reduced. This can further reduce processing time for cleaving of the wafer where individual semiconductor light emitting elements are singulated or separated.

Further, laser scanning is not limited to two passes and three or more scans are possible. For example, before the first laser irradiation, a third laser irradiation in which laser beam is focused at a third focal level may be performed. This can further accelerate crack extension to the first primary surface (front-side) of the substrate.

A nanosecond burst-pulse laser (1 ns to 1000 ns) can also be used in another embodiment of the method of manufacturing a semiconductor light emitting element of the present invention. In that case, at least one pulse of a laser irradiation by the nanosecond burst-pulse laser can be divided into two pulses separated by the picosecond interval as described in the present embodiment. Also, as long as including the method of manufacturing a semiconductor light emitting element according to embodiments of the present invention, a step of irradiating a third laser pulse may be further performed after the second laser pulse via a time interval of 3 ps to 900 ps. Further, irradiation with a fourth laser pulse may be performed after the third laser pulse via a similar time interval, or irradiation with a fifth laser pulse may be performed after the fourth laser pulse.

The semiconductor light emitting element produced by the method of manufacturing the present invention can be used for an LED, laser, or other semiconductor light emitting element as a light source of illumination (i.e. lighting), in an LED display device, as a light source of backlight device (e.g. in a liquid crystal display), in a traffic signal, in lighted switch applications, and in various sensor and indicator applications, and can also be widely applied in manufacturing of semiconductor light emitting elements. It should be apparent to those with an ordinary skill in the art that while various preferred examples of the invention have been shown and described, it is contemplated that the invention is not limited to the particular examples disclosed, which are deemed to be merely illustrative of the inventive concepts and should not be interpreted as limiting the scope of the invention, and which are suitable for all modifications and changes falling within the spirit and scope of the invention as defined in the appended claims.

The invention claimed is:

1. A method of manufacturing a semiconductor light emitting element, the method comprising:
preparing a wafer including a substrate and a semiconductor structure on the substrate; and
irradiating an inner portion of the substrate of the wafer at a predetermined depth in a thickness direction a plurality of times with laser pulses at a first time interval and a predetermined distance interval between irradiations,
wherein each irradiation performed at the first time intervals in the step of irradiating the substrate with laser pulses includes:
irradiating the substrate at a first focal position in the thickness direction with a first laser pulse having a first pulse-energy; and
after irradiating with the first laser pulse, irradiating the substrate with a second laser pulse performed after a second time interval, the second time interval being shorter than the first time interval and being in a range of 3 ps to 900 ps, and the second laser pulse having a second pulse-energy 0.5 to 1.5 times the first pulse-energy.

2. The method of manufacturing a semiconductor light emitting element according to claim 1 wherein, in the step of irradiating the substrate with the second laser pulse, the second pulse-energy of the second laser pulse is 0.8 to 1.2 times the first pulse-energy.

3. The method of manufacturing a semiconductor light emitting element according to claim 2 wherein the second time interval is in a range of 3 ps to 500 ps.

4. The method of manufacturing a semiconductor light emitting element according to claim 3 wherein the second time interval is in a range of 50 ps to 350 ps.

5. The method of manufacturing a semiconductor light emitting element according to claim 1, wherein the pulse-width of the first laser pulse and the second laser pulse are in a range of 100 fs to 10000 fs.

6. The method of manufacturing a semiconductor light emitting element according to claim 5, wherein the first time interval is in a range of 5 µs to 40 µs.

7. The method of manufacturing a semiconductor light emitting element according to claim 6, wherein the first pulse-energy of the first laser pulse is in a range of 0.5 µJ to 15 µJ.

8. The method of manufacturing a semiconductor light emitting element according to claim 7, wherein the substrate is a sapphire substrate.

9. The method of manufacturing a semiconductor light emitting element according to claim 6, wherein the substrate is a sapphire substrate.

10. The method of manufacturing a semiconductor light emitting element according to claim 5, wherein the first pulse-energy of the first laser pulse is in a range of 0.5 µJ to 15 µJ.

11. The method of manufacturing a semiconductor light emitting element according to claim 10, wherein the substrate is a sapphire substrate.

12. The method of manufacturing a semiconductor light emitting element according to claim 5, wherein the substrate is a sapphire substrate.

13. The method of manufacturing a semiconductor light emitting element according to claim 1, wherein the first time interval is in a range of 5 µs to 40 µs.

14. The method of manufacturing a semiconductor light emitting element according to claim 13, wherein the first pulse-energy of the first laser pulse is in a range of 0.5 µJ to 15 µJ.

15. The method of manufacturing a semiconductor light emitting element according to claim 14, wherein the substrate is a sapphire substrate.

16. The method of manufacturing a semiconductor light emitting element according to claim 13, wherein the substrate is a sapphire substrate.

17. The method of manufacturing a semiconductor light emitting element according to claim 1, wherein the first pulse-energy of the first laser pulse is in a range of 0.5 µJ to 15 µJ.

18. The method of manufacturing a semiconductor light emitting element according to claim 17, wherein the substrate is a sapphire substrate.

19. The method of manufacturing a semiconductor light emitting element according to claim 1, wherein the substrate is a sapphire substrate.

* * * * *